US008924765B2

(12) United States Patent
Sheafor

(10) Patent No.: US 8,924,765 B2
(45) Date of Patent: Dec. 30, 2014

(54) METHOD AND APPARATUS FOR LOW JITTER DISTRIBUTED CLOCK CALIBRATION

(75) Inventor: Stephen Sheafor, Boulder, CO (US)

(73) Assignee: Ambiq Micro, Inc., Austin, TX (US)

( * ) Notice: Subject to any disclaimer, the term of this patent is extended or adjusted under 35 U.S.C. 154(b) by 340 days.

(21) Appl. No.: 13/401,268

(22) Filed: Feb. 21, 2012

(65) Prior Publication Data

US 2013/0002314 A1 Jan. 3, 2013

Related U.S. Application Data

(60) Provisional application No. 61/504,223, filed on Jul. 3, 2011.

(51) Int. Cl.
*G06F 1/08* (2006.01)
*H03K 21/00* (2006.01)
*G05F 1/46* (2006.01)
*G06F 1/10* (2006.01)
*H03K 21/02* (2006.01)
*H03K 23/50* (2006.01)
*H03K 3/012* (2006.01)

(52) U.S. Cl.
CPC ...... *G05F 1/462* (2013.01); *G06F 1/08* (2013.01); *G06F 1/10* (2013.01); *H03K 21/023* (2013.01); *H03K 23/50* (2013.01); *H03K 3/012* (2013.01)
USPC ............ 713/503; 713/500; 713/501; 714/700; 702/106; 331/44

(58) Field of Classification Search
CPC ....... G06F 1/10; G06F 7/605; G01R 31/3191; H03L 7/00; H03K 21/00
USPC ............ 713/500, 501, 503; 714/700; 702/85; 327/115, 117; 331/34, 44; 375/224
See application file for complete search history.

(56) References Cited

U.S. PATENT DOCUMENTS

| | | | | |
|---|---|---|---|---|
| 3,601,591 A | * | 8/1971 | Gaines et al. | 708/102 |
| 4,179,670 A | * | 12/1979 | Kingsbury | 331/10 |
| 5,260,887 A | * | 11/1993 | Ozaki | 708/205 |
| 5,262,716 A | * | 11/1993 | Gregory et al. | 324/750.02 |
| 5,983,014 A | * | 11/1999 | Shay | 702/60 |
| 6,417,707 B1 | * | 7/2002 | Underhill et al. | 327/165 |
| 6,545,950 B1 | | 4/2003 | Walukas et al. | |
| 6,853,698 B1 | * | 2/2005 | Nguyen | 377/29 |
| 6,885,254 B2 | | 4/2005 | Kranz | |
| 7,078,952 B2 | | 7/2006 | Ruat et al. | |
| 7,190,174 B2 | * | 3/2007 | Doi | 324/601 |
| 7,764,131 B1 | * | 7/2010 | Seth et al. | 331/46 |
| 2008/0016384 A1 | * | 1/2008 | Smith et al. | 713/375 |
| 2008/0082279 A1 | * | 4/2008 | Ashburn et al. | 702/85 |
| 2011/0158031 A1 | * | 6/2011 | Ware et al. | 365/233.11 |

* cited by examiner

*Primary Examiner* — Thuan Du
(74) *Attorney, Agent, or Firm* — Jeffrey Van Myers; Artie A. Pennington

(57) ABSTRACT

A method and apparatus for generating an accurate clock generator timing source, comprising minimal jitter, excellent resolution, and an extended calibration range, for use, for example, in a system requiring accurate low power operation. In particular, a clock generation system is adapted to receive a generated clock input, a reference clock input, and an adjustment parameter comprising a sign bit and p data bits. The calibration logic system is further adapted to output and modify a calibrated clock, using distributed pulse modification. The adjustment parameter may be automatically generated.

31 Claims, 7 Drawing Sheets

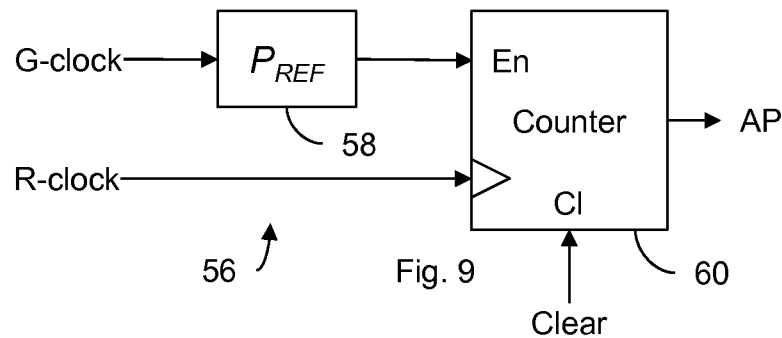
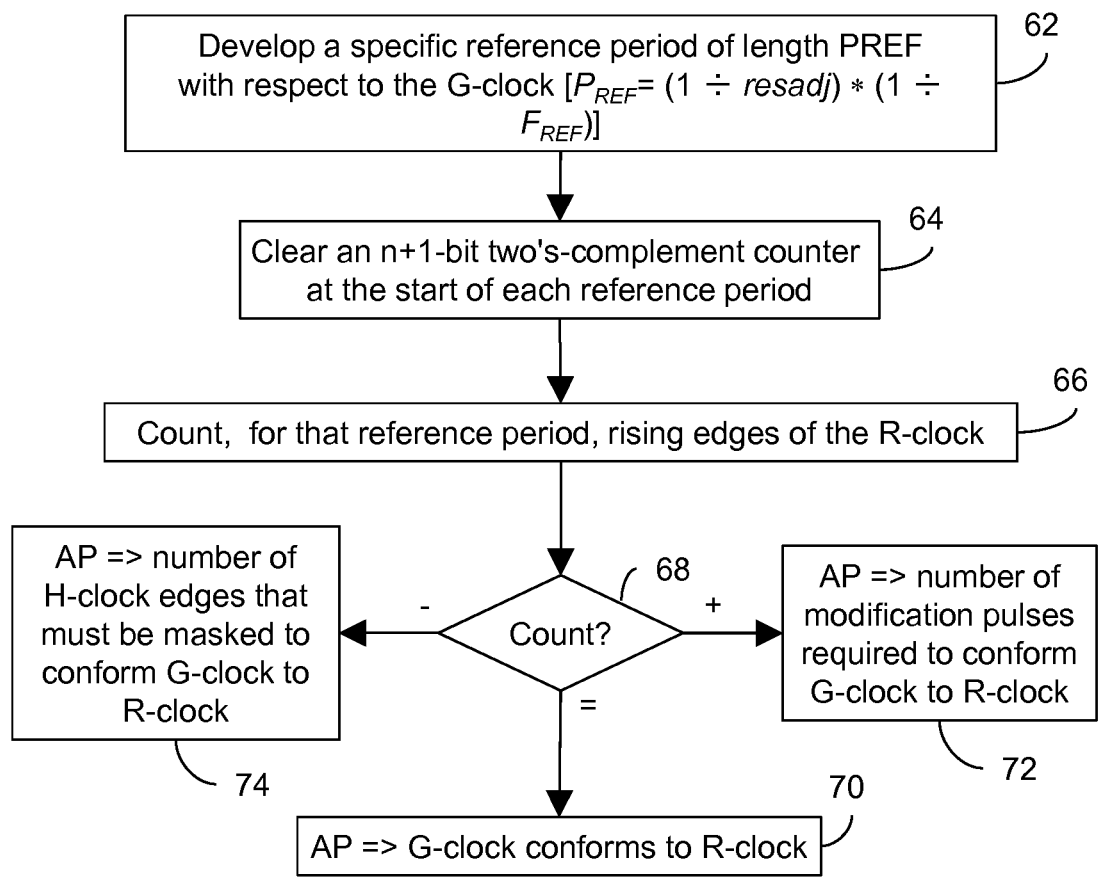

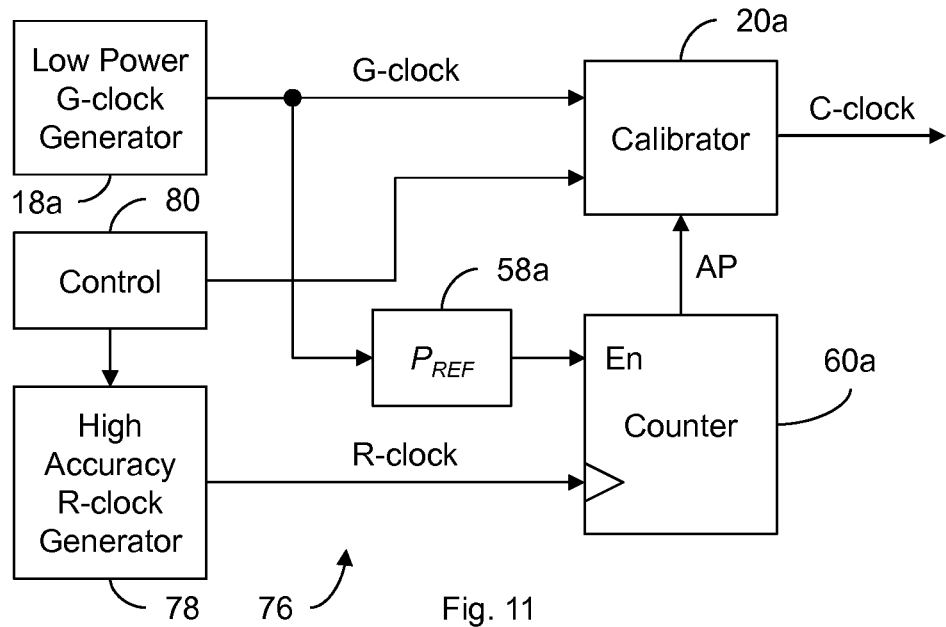
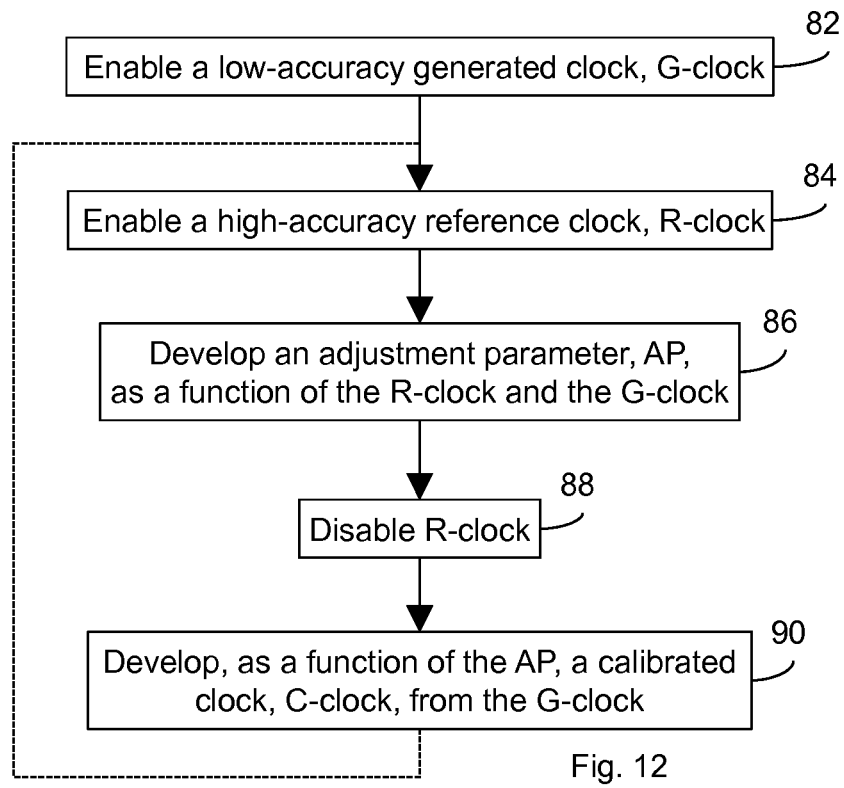

METHOD AND APPARATUS FOR LOW JITTER DISTRIBUTED CLOCK CALIBRATION

CROSS-REFERENCE TO RELATED APPLICATIONS

This application claims priority to U.S. Provisional Patent Application Ser. No. 61/504,223, filed 3 Jul. 2011 ("Parent Provisional"). The forgoing Parent Provisional is hereby incorporated by reference in its entirety as if fully set forth herein.

BACKGROUND OF THE INVENTION

1. Field of the Invention

The present invention relates generally to integrated circuit design of a timing source adapted to generate a very accurate time reference over a significant time period, and, in particular, such a source usually operates continuously and is adapted to provide accurate low power operation.

2. Description of the Related Art

In general, in the descriptions that follow, I will italicize the first occurrence of each special term of art that should be familiar to those skilled in the art of integrated circuits and systems. In addition, when I first introduce a term that I believe to be new or that I will use in a context that I believe to be new, I will bold the term and provide the definition that I intend to apply to that term. In addition, throughout this description, I will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, I may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Many systems require a timing source adapted to generate a very accurate time reference over a significant time period. Because such sources usually operate continuously, accurate low power operation is highly desirable. Generally, the high power consumption of current integrated circuit technology has become a critical problem for mobile electronics that must run for days, months, or even years on a single battery charge. As is known, an accurate clock generator is a key element in the overall design of integrated circuits. Such a clock generator may be used in an integrated circuit to dramatically reduce power consumption, significantly extend battery life, and reduce battery size and cost.

Since various factors often result in higher variability in the frequency of the timing source, systems may implement a mechanism for calibrating the generated clock to a known reference frequency using any of a number of known analog or digital techniques. As noted in my Parent Provisional, one such technique used in prior art systems is known as burst pulse modification.

As discussed in my Parent Provisional, I submit that what is needed is an improved method and apparatus for generating an accurate clock generator timing source, comprising minimal jitter, excellent resolution, and an extended calibration range, for use, for example, in a system requiring accurate low power operation. In particular, I submit that such a method and apparatus should provide performance generally comparable to the best prior art techniques while requiring less circuitry and consuming less power than known implementations of such prior art techniques.

BRIEF SUMMARY OF THE INVENTION

In accordance with the preferred embodiment of my invention, I provide a clock calibration system to modify, as a function of an adjustment parameter ("AP"), a generated clock ("G-clock") having a selected frequency ("F") to produce a calibrated clock ("C-clock") having a desired frequency. In operation, a C-clock calibrator develops a half clock ("H-clock") having a frequency substantially one-half ($\frac{1}{2}$) the frequency of the G-clock and selectively over time the C-clock calibrator distributes pulse modifications in response to the AP, each modification performing a selected one of a pulse deletion and a pulse insertion in the H-clock to produce the C-clock.

In one embodiment, a trigger pulse ("T-pulse") generator develops the H-clock and develops, as a function of the AP, a stream of T-pulses. A C-clock generator provides as the C-clock the H-clock, if a T-pulse in the T-pulse stream is negated and otherwise, either the G-clock or a predetermined logic level as a function of a value of a sign, s, of the AP ("$AP_s$"), if the T-pulse in the T-pulse stream is asserted. In some embodiments, the T-pulse generator develops from the G-clock a plurality, n, of Q-clocks, each being a respective sub-multiple of the G-clock divided by $2^{[m:m+n-1]}$, for an integer, m, and each comprising a plurality of Q-pulses each comprising a rising-edge and a falling-edge. The T-pulse generator develops H-clock from the G-clock and develops a T-pulse of predetermined duration from each clock cycle of each of the respective Q-clocks. Depending on the $AP_s$ and respective bits of the AP value, the T-pulse generator combines selected T-pulses into the T-pulse stream.

In one embodiment, an adjustment parameter ("AP") generator develops an AP, in a two's complement form, as a function of a frequency mismatch between a generated clock ("G-clock") having a selected frequency ("F"), and a reference clock ("R-clock") of known frequency ("$F_{REF}$"). "$P_{REF}$"). In operation, a reference period ("$P_{REF}$") generator develops a $P_{REF}$ as a function of the G-clock. An n+1-bit two's-complement counter counts the R-clock pulses during $P_{REF}$, where the resulting count, will be the AP value. If the resulting count is positive, the AP value represents a number of pulses to be added to conform G-clock to R-clock. If the resulting count is negative, the AP value represents a number of edges to be deleted to conform G-clock to R-clock. If the resulting count is zero, the AP value represents that G-clock conforms to R-clock.

In another embodiment, a control enables the n+1-bit two's-complement counter to count edges of the R-clock to develop the AP, when the $P_{REF}$ is asserted.

In yet another embodiment, a multiple clock calibration system selectively modifies, as a function of an adjustment parameter ("$AP^C$"), a generated clock ("G-clock") having a frequency ("$F_G$") to produce a calibrated clock ("C-clock") having a desired frequency, and further modifies, as a function of an adjustment parameter ("$AP^G$"), a reference clock ("R-clock") having a selected frequency ("$F_R$") to produce the G-clock. In operation, a C-clock calibrator develops a first half clock ("H-clock$_1$") having a frequency substantially one-half ($\frac{1}{2}$) the frequency of the G-clock; and selectively over time distributes pulse modifications in response to the $AP^C$, each modification performing either a pulse deletion or a pulse insertion in the H-clock$_s$ to produce the C-clock.

Finally, a G-clock generator develops a second half clock ("H-clock$_2$") having a frequency substantially one-half (½) the frequency of the R-clock and selectively over time distributes pulse modifications in response to the AP$^G$, each modification performing either a pulse deletion or a pulse insertion in the H-clock$_2$ to produce the G-clock.

I submit that each of these embodiments of my invention provide performance generally comparable to the best prior art techniques while requiring less circuitry and consuming less power than known implementations of such prior art techniques.

BRIEF DESCRIPTION OF THE SEVERAL VIEWS OF THE DRAWINGS

My invention may be more fully understood by a description of certain preferred embodiments in conjunction with the attached drawings in which:

FIG. 9 illustrates, in block diagram form, an AP generator constructed in accordance with my invention;

FIG. 10 illustrates, in flow diagram form, the sequencing of the operations in the AP generator shown in FIG. 9;

FIG. 11 illustrates, in block diagram form, a hybrid clock generation system, constructed in accordance with my invention;

FIG. 12 illustrates, in flow diagram form, the sequencing of the operations in the hybrid clock generation system shown in FIG. 11;

Figure 1:
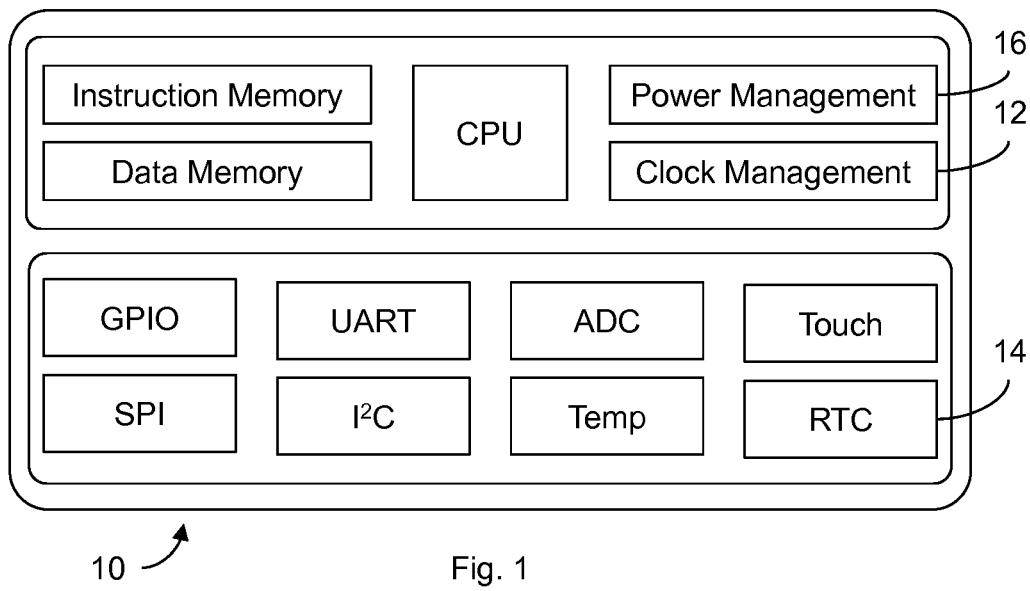
FIG. 1 illustrates, in block diagram form, a typical integrated system.

In the drawings, similar elements will be similarly numbered whenever possible. However, this practice is simply for convenience of reference and to avoid unnecessary proliferation of numbers, and is not intended to imply or suggest that my invention requires identity in either function or structure in the several embodiments.

DETAILED DESCRIPTION OF THE INVENTION

Figure 2:
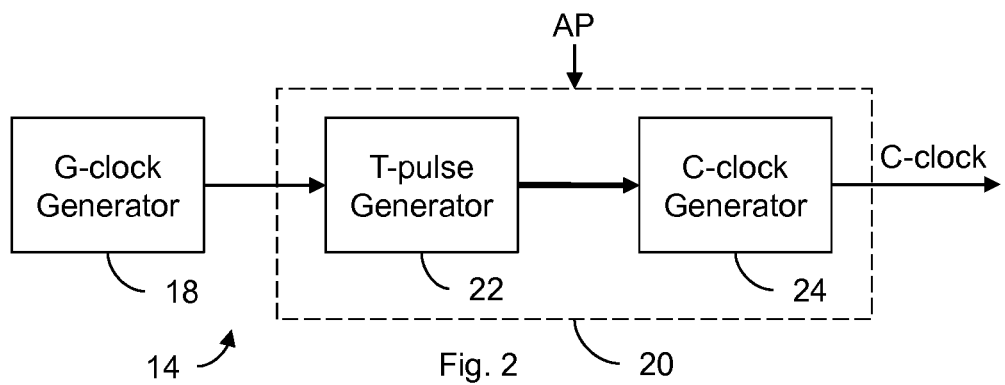
FIG. 2 illustrates, in block diagram form, a digital clock calibration circuit constructed in accordance with my invention.

Shown in FIG. 1 is a typical system 10 comprising, inter alia, a clock management unit 12, a real time clock ("RTC") 14, and a power management unit 16. Shown in FIG. 2 is a clock generation system 14 suitable for use as RTC 14, generally comprising: a G-clock generator 18 adapted to develop a generated clock, G-clock, having a selected frequency, F; and a clock calibrator 20 adapted to selectively modify G-clock as a function of an adjustment parameter ("AP") to produce a calibrated clock, C-clock, of a desired frequency. In one embodiment, calibrator 20 further comprises a T-pulse generator 22 and a C-clock generator 24. In accordance with my invention, calibrator 20 is adapted to implement a novel algorithm that I refer to as distributed pulse modification in accordance with which single cycle pulse modifications are selectively distributed over time, resulting in minimal jitter, excellent resolution, and an extended calibration range.

Figure 3:
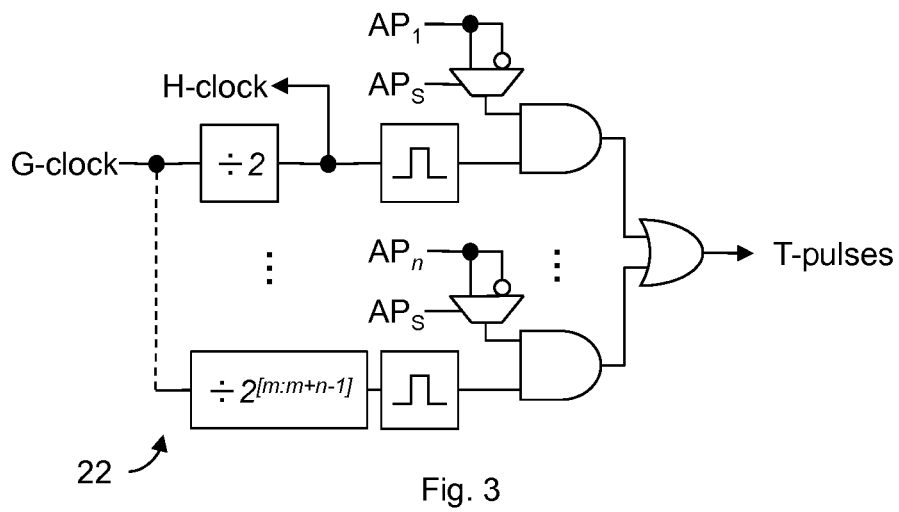
FIG. 3 illustrates, in block diagram form, the T-pulse generator of FIG. 2.
Figure 5:
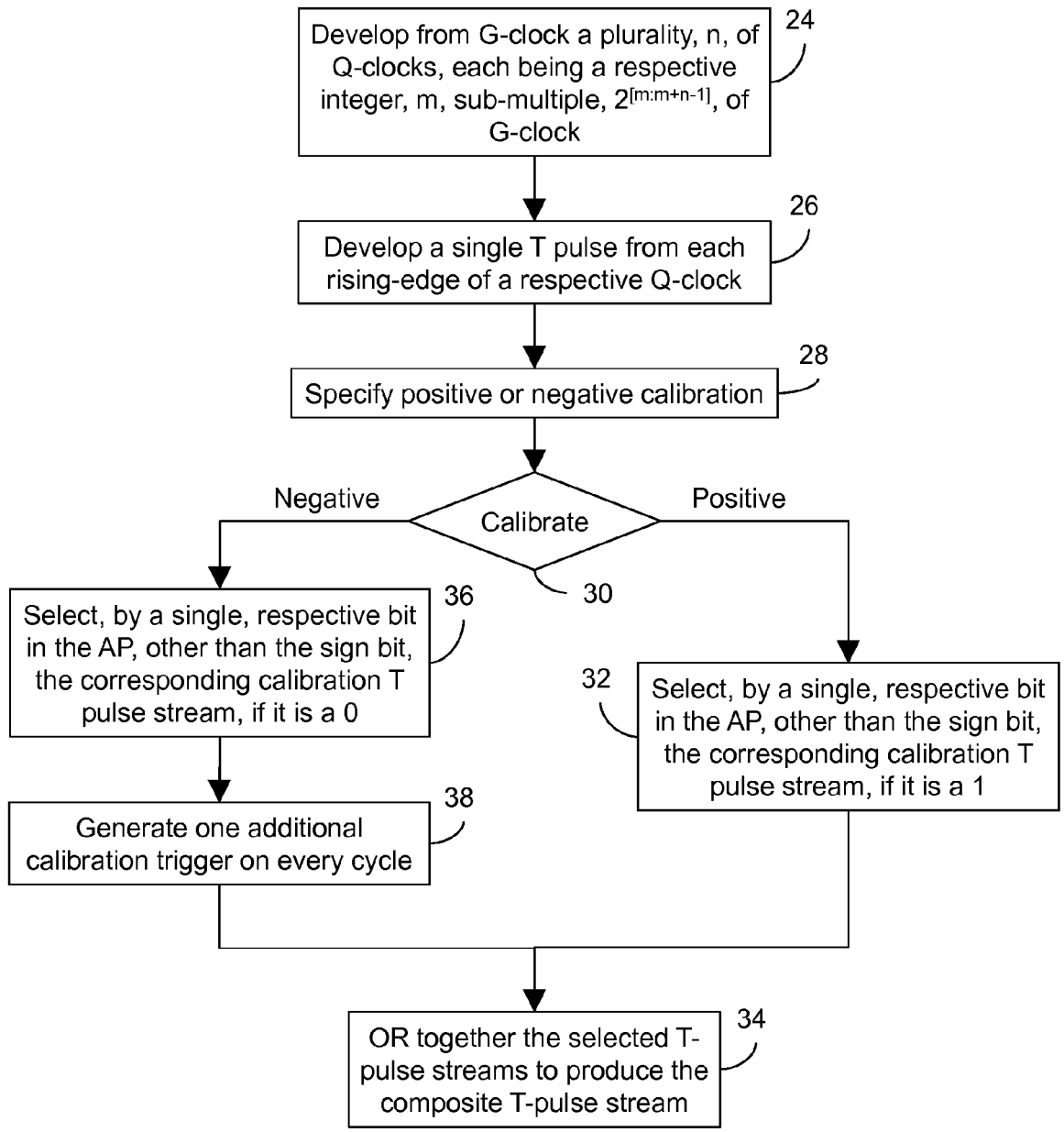
FIG. 5 illustrates, in flow diagram form, the sequencing of the operations in the T-pulse generator of FIG. 3.

As shown in FIG. 3, my T-pulse generator 22 is adapted first to develop from G-clock a plurality, n, of Q-clocks, each being a respective sub-multiple of G-clock divided by $2^{[m:m+n-1]}$, for an integer, m (step 24 in FIG. 5). My T-pulse generator 22 is further adapted to develop H-clock, being ½ the frequency of G-clock, i.e., $F_{HALF}$. From each clock cycle of a respective Q-clock, T-pulse generator 22 then develops a single T-pulse of predetermined duration (step 26 in FIG. 5). By way of example, in one embodiment, T-pulse generator 22 initially develops each trigger pulse substantially equal to ½ the width of the highest frequency Q-clock. From a selected one of an asserted edge or a negated edge of each trigger pulse, T-pulses are developed to have a duration substantially equal to one H-clock cycle. Depending on the sign, s, of the AP value and respective bits of the AP value (as further explained below), T-pulse generator 22 will combine selected T-pulses into a single T-pulse stream.

Figure 4:
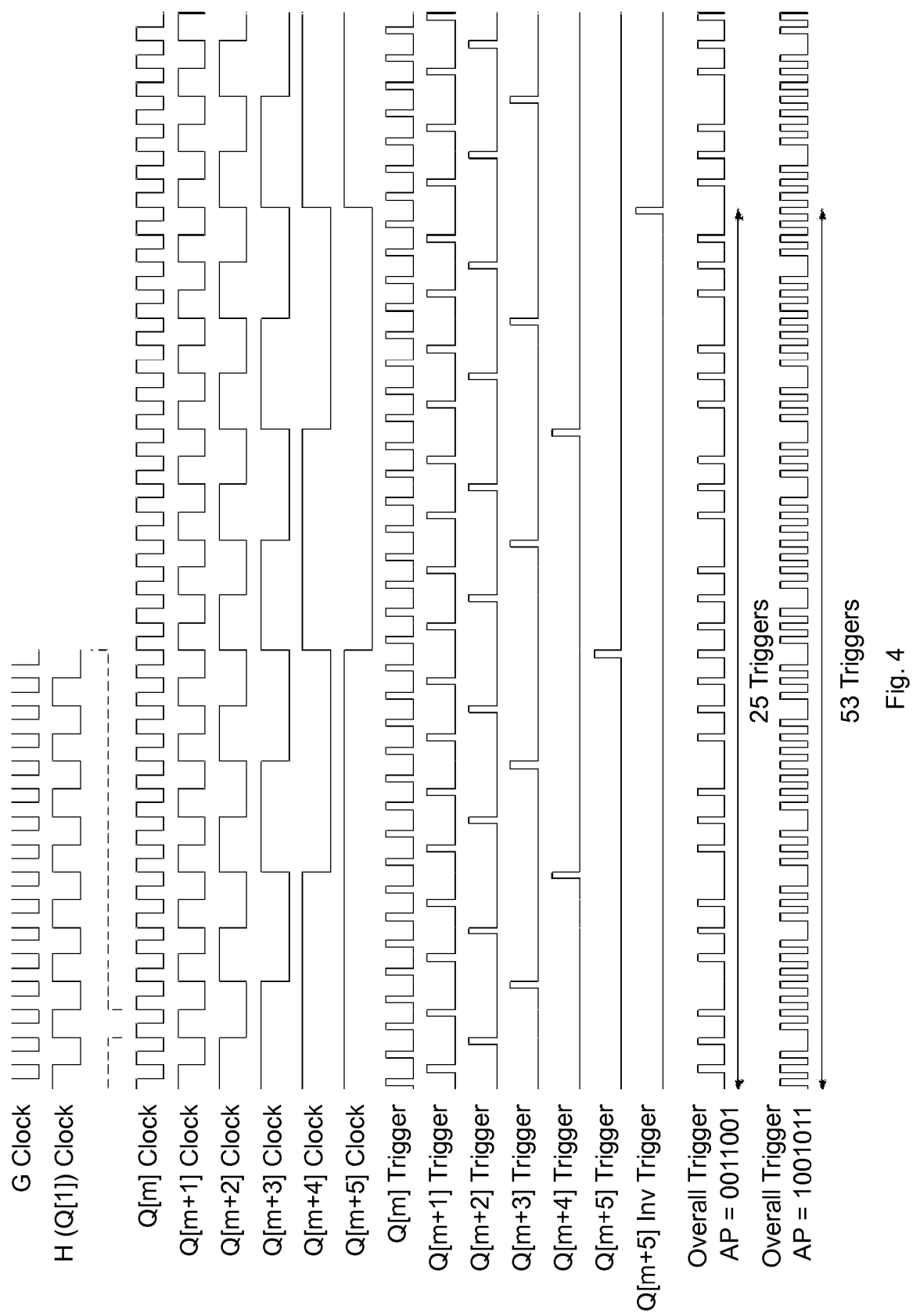
FIG. 4 illustrates, in timing diagram form, T-pulse generation by the T-pulse generator of FIG. 3.

By way of example, I have illustrated in FIG. 4 waveforms developed by an embodiment of my T-pulse generator 22 wherein n=6 and m=4. As can be seen, each Q-clock (comprising traces Q[m] through Q[m+5]) is divided by a next successive higher power of 2, which may be easily implemented in a low power ripple counter or by a synchronous counter. In many applications such a divider is required for other reasons and, if available for reuse, may add no additional cost. Each power of 2 division generates a particular frequency, $F_{PWR2}$, which generates one calibration T-pulse per cycle (comprising next 6 traces). The resolution of the calibration adjustment, resadj, created by each calibration T-pulse is given by the equation:

$$resadj = F_{PWR2}/F_{HALF}$$

where:

$F_{PWR2}$=a frequency that is a selected power of 2; and $F_{HALF}$=½ the G-clock frequency, i.e., the H-clock frequency.

For example, if $F_{HALF}$=64 Hz and $F_{PWR2}$=2 Hz, the resolution adjustment is:

$$resadj = 2/64 = 1/32 = 3.1\%$$

Each successively lower frequency T-pulse stream creates a resolution adjustment of half the previous one. Thus, if a 2 ppm resadj is desired and $F_{HALF}$ is 64 Hz, $F_{PWR2}$=⅛K Hz (one cycle every 8,192 seconds).

Each respective calibration T-pulse stream, i.e., waveform, is selected by a single, respective bit in the AP, and the selected T-pulse streams are ORed together to produce the composite T-pulse stream (step 34 in FIG. 5). If $F_{HALF}$ is 64 Hz, 15 bits of AP could be applied to sub-divided frequencies from 2 Hz to ⅛K Hz; this would provide a resolution adjustment of 2 ppm and a maximum adjustment range of 3.1%, with a maximum jitter of 1/64 second.

Since the C-clock may be faster or slower than the G-clock, the AP must be able to specify positive or negative calibration (step 28 in FIG. 5). Although I am aware of at least three feasible ways to specify the calibration to include both positive and negative values, i.e., sign-magnitude, one's complement or two's complement, I prefer the latter because it simplifies development of the AP (as will be explained below). Using two's complement form, the AP is interpreted as an n+1 bit two's complement value. If the sign bit is logic_0, indicating positive calibration (step 30 in FIG. 5), each bit of the AP other than the sign bit selects the corresponding calibration T-pulse stream if it is a logic_1 (step 32 in FIG. 5). If the sign bit is logic_1, indicating negative calibration (step 30 in FIG. 5), each bit of the AP other than the sign bit selects the corresponding calibration T-pulse stream if it is a logic_0 (step 36 in FIG. 5), and one additional calibration trigger is generated on every cycle (step 38 in FIG. 5); the optimal place to generate the additional trigger is at the rising edge of the lowest frequency clock (see, e.g., the "Q[m+5] Inv Trigger" trace).

By way of example, the bottom two waveforms in FIG. 4 illustrate two possible T-clock streams, each developed by a different AP. In the trace labeled "Overall Trigger AP=0011001", the AP value is positive (MSB=0) and combines the individual m+1, m+2, and m+5 T-pulse streams for output as the composite T-pulse stream; as a result, a total of 25 T-pulses are developed each major cycle. In the trace labeled "Overall Trigger AP=1001011", the AP value is negative (MSB=1) and combines the individual m, m+1, m+3 and, by default, m+5_Inv T-pulse streams for output as the composite T-pulse stream; as a result, a total of 53 T-pulses are developed each major cycle.

Shown in FIG. 5, as described above, is the operational flow of my T-pulse generator illustrated in FIG. 3.

Figure 6:
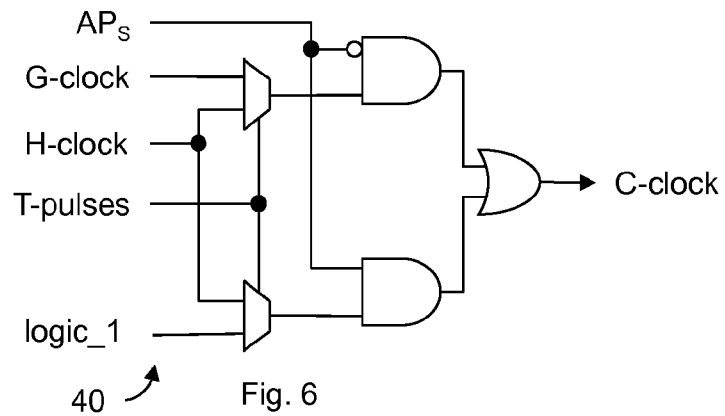
FIG. 6 illustrates, in block diagram form, the C-clock generator of FIG. 2.
Figure 8:
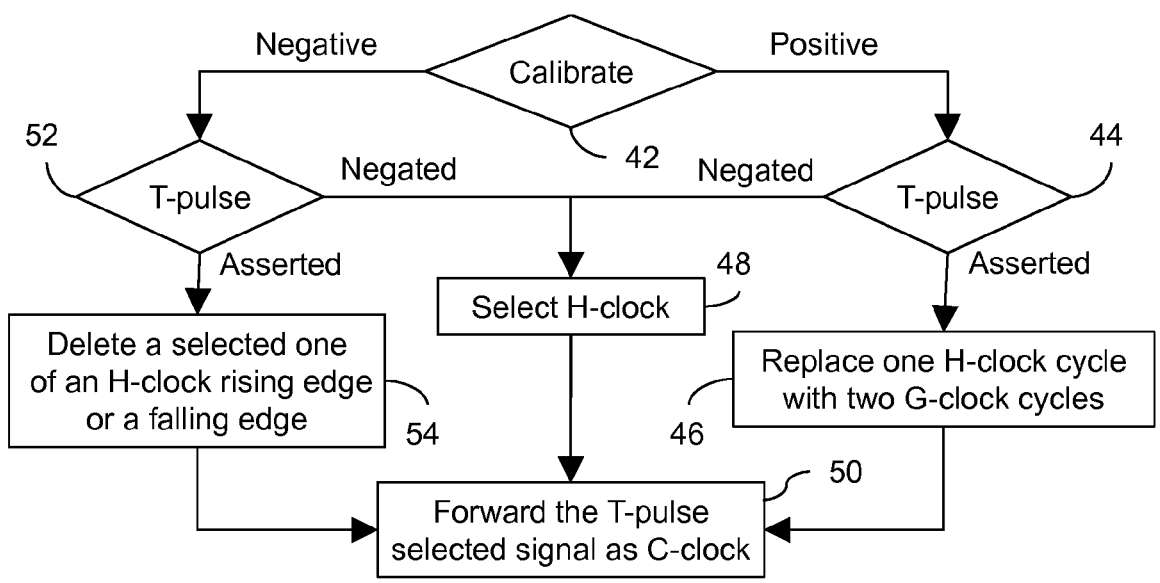
FIG. 8 illustrates, in flow diagram form, the sequencing of the operations in the C-clock generator of FIG. 6.

As shown in FIG. 6, by way of example, my C-clock generator 40 is adapted first to perform two simultaneous selections depending on the state of the current T-pulse (steps 44 and 52 in FIG. 8): 1) the G-clock if asserted and H-clock if negated (step 48 in FIG. 8); and 2) a logic_1 if asserted and H-clock if negated (step 48 in FIG. 8). Depending on the value of $AP_s$, C-clock generator 40 then forwards the T-pulse-selected signal as C-clock (step 50 in FIG. 8). For my invention, it should be noted that C-clock is actually a calibrated version of H-clock. As a result, G-clock will always be at least twice the frequency of the desired calibrated C-clock.

Figure 7:
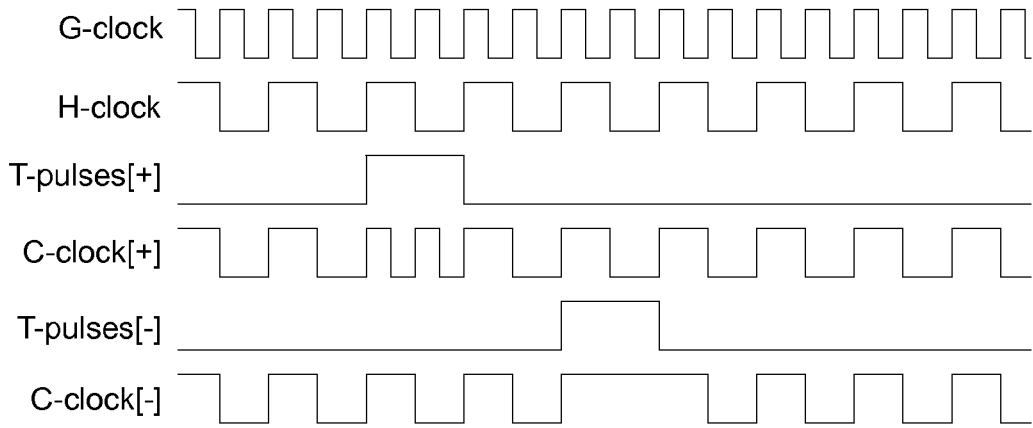
FIG. 7 illustrates, in timing diagram form, C-clock generation by the C-clock generator of FIG. 6.

By way of example, the 3rd and 4th traces in FIG. 7 illustrate the effect of a single T-pulse on C-clock for a positive AP (step 42 in FIG. 8); note the effective insertion of one additional rising edge as a result of replacing one H-clock cycle with two G-clock cycles (step 46 in FIG. 8). In contrast, the 5th and 6th traces in FIG. 7 illustrate the effect of a single T-pulse on C-clock for a negative AP (step 42 in FIG. 8); note the effective deletion of one rising edge as a result of masking one full H-clock cycle (step 54 in FIG. 8). Alternately, in another embodiment, the effective deletion of one falling edge as a result of masking one full H-clock cycle may be accomplished with minimal logic changes to FIG. 6. In accordance with my distributed burst modification technique, the maximum jitter is the period of the H-clock.

Shown in FIG. 8, as described above, is the operational flow of my C-clock generator illustrated in FIG. 6.

Shown in FIG. 9 is an AP generator 56 adapted to develop the AP, in a two's complement form, as a function of the frequency mismatch between the G-clock and a reference clock, R-clock, of known frequency $F_{REF}$. First, a reference period generator 58 periodically develops a specific reference period of length $P_{REF}$ with respect to the G-clock as follows:

$P_{REF}=(1+\text{resadj})*(1+F_{REF})$(step 62 in FIG. 10)

At the start of each reference period, an n+1-bit two's-complement counter 60 is cleared (step 64 in FIG. 10). During that reference period, counter 60 counts rising edges of the R-clock (step 66 in FIG. 10). At the end of the reference period, the developed count directly represents the desired AP value (step 68 in FIG. 10). If the frequency of the G-clock and R-clock are exactly the same, then the count value, i.e., AP, will be exactly zero (0), indicating that G-clock conforms to R-clock (step 70 in FIG. 10). If, however, G-clock is slower than R-clock, the resulting positive AP will precisely represent the number of modification pulses required to conform G-clock to R-clock (step 72 in FIG. 10). Similarly, if G-clock is faster than R-clock, the resulting negative AP will precisely represent the number of H-clock edges that must be masked to conform G-clock to R-clock (step 74 in FIG. 10). In accordance with this embodiment, as shown in FIG. 3, the logic state of each $AP_x$ bit is selectively inverted depending on the $AP_s$; as a result of this inversion, counter 60 effectively down-counts from max-positive to min-positive and then, after sign overflow, up-counts from min-negative to max-negative. Unlike known implementations that calculate the ratio between the G-clock and the R-clock, my embodiment does not require a programmable divider, and, thus, is both less complex and lower power.

Shown in FIG. 10, as described above, is the operational flow of my AP generator illustrated in FIG. 9.

Shown in FIG. 11 is a hybrid clock generation system 76 constructed in accordance with my invention. In this embodiment, I provide a high accuracy R-clock generator 78, such as a crystal oscillator, and a G-clock generator 18a, such as an RC oscillator. In alternate embodiments, R-clock generator 78 and G-clock generator 18a may each be implemented as a crystal oscillator or an RC oscillator. During start-up, G-clock generator 18a is enabled (step 82 in FIG. 12). Following the enabling of G-clock generator 18a, control 80 enables R-clock generator 78 (step 84 in FIG. 12) to cooperate with reference period generator 58a and counter 60a to develop an AP, as a function of the R-clock and the G-clock, for initial use by calibrator 20a (step 86 in FIG. 12). After an AP is developed, control 80 may disable the R-clock generator 78 (step 88 in FIG. 12). Thereafter, calibrator 20a uses the AP output by counter 60a to develop C-clock from G-clock generator 18a (step 90 in FIG. 12). In one embodiment, control 80 periodically enables R-clock generator 78 again to cooperate with reference period generator 58a and counter 60a to develop a fresh AP for use by calibration logic 20a (return to step 84 in FIG. 12). If the period between AP refresh cycles is significantly longer than the length of a calibration cycle, the power dissipation of the hybrid system 76 may be similar to that of the clock generation system 14 (see, FIG. 2), while the accuracy may be similar to that of the high accuracy R-clock generator 78. In another embodiment, control 80 enables R-clock generator 78 to cooperate with reference period generator 58a and counter 60a, based on an interrupt scheme, to develop a fresh AP for use by calibration logic 20a (return to step 84 in FIG. 12). For example, in one embodiment, an interrupt of such an interrupt scheme may occur at a predetermined selectable time interval. In an alternate embodiment, such an interrupt may be generated as a result of a sensor detecting that a circuit, system or environmental condition, e.g., temperature, exceeds a predetermined threshold.

After manufacturing, integrated circuits are tested using equipment having high accuracy clock sources. As is known, the time of internal clock calibration typically has a significant impact on the manufacturing cost of the circuit, and my distributed pulse modification technique may significantly reduce this calibration time. In one embodiment, control 80 may be constructed so as selectively to couple counter 60a to a suitable external R-clock source (not shown). In this case, the R-clock source may be several powers of 2 faster than it would be in the typical case, and the reference period may be shortened by the same factor, while still preserving the calibration resolution (resadj). By way of example, in the normal case an on-chip R-clock generator 78 might run at 32 KHz and a reference period of 16 seconds would produce a resolution adjustment of roughly 2 ppm. In a manufacturing environment, an external R-clock source of 512 KHz would produce the same 2 ppm resolution, but with only a 1 second reference period. In an alternate embodiment, it can be seen that the reference period may be shortened further, resulting in a corresponding reduction of resadj. In a manufacturing environment, a benefit of such an approach is a faster adjustment time. Of course, this accelerated manufacturing calibration approach may be the only alternative in situations where a high accuracy reference clock is not available in normal operation. In the latter case, the initial manufacturing calibration is the only mechanism for developing the AP. For such embodiments, the AP developed during manufacturing testing may be stored in an on-chip non-volatile memory element (not shown) for use during subsequent chip operation.

Shown in FIG. 12, as described above, is the operational flow of my hybrid clock generation system illustrated in FIG. 11.

Figure 13:
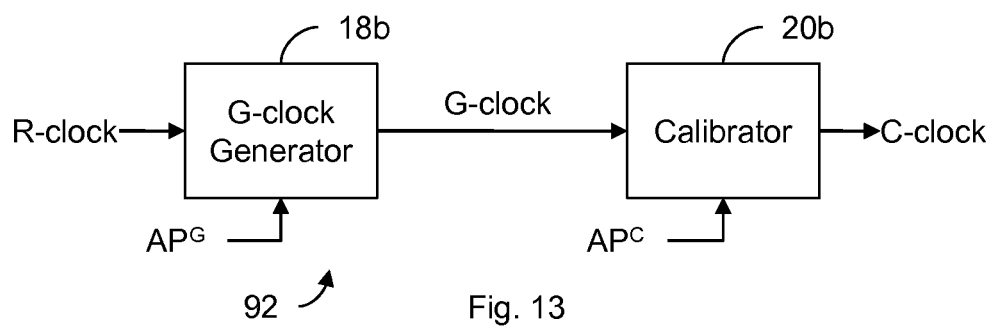
FIG. 13 illustrates, in block diagram form, a digital clock calibration circuit constructed in accordance with yet another embodiment of my invention.

As shown in FIG. 13, my distributed pulse modification method may be effectively applied to multiple clocks. Thus, for example, my method may be first applied to develop an $AP^G$ for use by G-clock generator 18b (step 94 in FIG. 14) to modify a supplied R-clock to more precisely develop the G-clock (step 96 in FIG. 14); and then a second time to develop an $AP^C$ for use by calibrator 20b (step 98 in FIG. 14) to modify the G-clock to more precisely develop the C-clock (step 100 in FIG. 14). In one embodiment, the $AP^G$ may be developed using a manual calibration process, and $AP^C$ may be developed in accordance with my automatic calibration method, although other alternative implementations are feasible.

Figure 14:
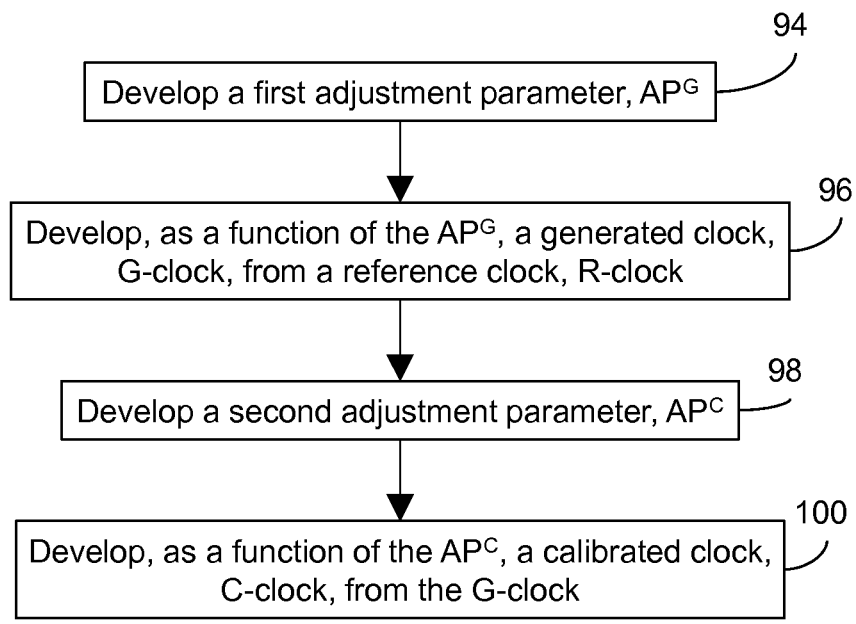
FIG. 14 illustrates, in flow diagram form, the sequencing of the operations in the digital clock calibration circuit shown in FIG. 13.

Shown in FIG. 14, as described above, is the operational flow of my digital clock calibration circuit illustrated in FIG. 13.

Thus it is apparent that I have provided an improved method and apparatus for generating an accurate clock generator timing source, comprising minimal jitter, excellent resolution, and an extended calibration range, for use, for example, in a system requiring accurate low power operation. In particular, I submit that my method and apparatus provides performance generally comparable to the best prior art techniques while requiring less circuitry and consuming less power than known implementations of such prior art techniques. Therefore, I intend that my invention encompass all such variations and modifications as fall within the scope of the appended claims.

What I claim is:

1. A clock calibration system adapted selectively to modify, as a function of an adjustment parameter ("AP"), a generated clock ("G-clock") having a selected frequency ("F") to produce a calibrated clock ("C-clock") having a desired frequency, said clock calibration system comprising:
    a C-clock calibrator adapted to:
        develop a half clock ("H-clock") having a frequency substantially one-half (½) the frequency of said G-clock; and
        selectively over time distribute pulse modifications in response to the AP, each of said modifications performing a selected one of deletion of a single pulse and insertion of a single pulse in the H-clock to produce the C-clock.

2. A clock calibration system adapted selectively to modify, as a function of an adjustment parameter ("AP"), a received clock ("G-clock") having a selected frequency ("F") to produce a calibrated clock ("C-clock") having a desired frequency, said clock calibration system comprising:
    a trigger pulse ("T-pulse") generator adapted to:
        develop a half clock ("H-clock") having a frequency substantially one-half (½) the frequency of said G-clock; and
        develop as a function of said AP a stream of T-pulses; and
    a C-clock generator adapted to provide as said C-clock:
        a single pulse of said H-clock, if a T-pulse in said T-pulse stream is negated; and
        otherwise, a selected one of a single pulse of said G-clock and a single pulse having a predetermined logic level as a function of a value of a sign, s, of said AP ("$AP_s$"), if said T-pulse in said T-pulse stream is asserted.

3. The clock calibration system of claim 2 wherein a calibration adjustment resolution ("resadj") created by each said T-pulse is given by the equation:

$$resadj = F_{PWR2}/F_{HALF}.$$

4. The clock calibration system of claim 2 wherein said AP is specified by a selected one of sign-magnitude, one's complement, and two's complement form.

5. The clock calibration system of claim 2 wherein if said $AP_s$ is a logic_1, each bit of said AP other than said $AP_s$ selects said T-pulse stream if said bit of said AP is a logic_0.

6. The clock calibration system of claim 2 wherein if said $AP_s$ is a logic_0, each bit of said AP other than said $AP_s$ selects said T-pulse stream if said bit of said AP is a logic_1.

7. The clock calibration system of claim 2 wherein if said AP is specified by two's complement form, one additional T-pulse is generated during a reference period, if said value of $AP_s$ is a first value.

8. A clock calibration system adapted selectively to modify, as a function of an adjustment parameter ("AP"), a received clock ("G-clock") having a selected frequency ("F") to produce a calibrated clock ("C-clock") having a desired frequency, said clock calibration system comprising:
    a trigger pulse ("T-pulse") generator adapted to:
        develop from said G-clock a plurality, n, of Q-clocks, each being a respective sub-multiple of said G-clock divided by $2^{[m:m+n-1]}$, for an integer, m, and each comprising a plurality of Q-pulses each comprising a rising-edge and a falling-edge;
        develop from said G-clock a half clock ("H-clock") having a frequency substantially one-half (½) the frequency of said G-clock;
        develop a T-pulse of predetermined duration from each clock cycle of each of said respective Q-clocks; and
        depending on a value of a sign, s, of said AP ("$AP_s$") and respective bits of said AP value, combine selected T-pulses into a T-pulse stream; and
    a C-clock generator adapted to provide as said C-clock:
        said H-clock, if a T-pulse in said T-pulse stream is negated; and
        otherwise, a selected one of said G-clock and a predetermined logic level as a function of said $AP_s$ if said T-pulse in said T-pulse stream is asserted.

9. The clock calibration system of claim 8 further comprising:
    a G-clock generator, coupled to said T-pulse generator, adapted to develop said G-clock.

10. The clock calibration system of claim 9 wherein said G-clock generator is a selected one of an RC oscillator and a crystal oscillator.

11. The clock calibration system of claim 8 wherein, from initial pulses of duration substantially equal to ½ the width of the highest frequency Q-clock, said T-pulse generator develops each of said T-pulse to have said predetermined duration substantially equal to one cycle of said H-clock.

12. The clock calibration system of claim 8 wherein each of said Q-clocks is generated using a selected one of a ripple counter and a synchronous counter.

13. An adjustment parameter ("AP") generator, adapted to develop an AP, in a two's complement form, as a function of a frequency mismatch between a generated clock ("G-clock") having a selected frequency ("F"), and a reference clock ("R-clock") of known frequency ("$F_{REF}$") the AP generator comprising:
a reference period ("$P_{REF}$") generator adapted to develop a $P_{REF}$ as a function of said G-clock; and
an n+1-bit two's-complement counter adapted to count said R-clock pulses during said $P_{REF}$, wherein the resulting count, being said AP:
if positive, represents a number of pulses to be added to conform G-clock to R-clock;
if negative, represents a number of edges to be deleted to conform G-clock to R-clock; and
if zero, represents that G-clock conforms to R-clock.

14. The AP generator of claim 13 wherein said $P_{REF}$ generator develops said $P_{REF}$ as:

$$P_{REF}=(1+\text{resadj})*(1+F_{REF})$$

where:

$$\text{resadj}=F_{PWR2}/F_{HALF};$$

$F_{PWR2}$=a frequency that is a selected power of 2;
$F_{HALF}$=½ the G-clock frequency, i.e., the H-clock frequency; and
$F_{REF}$=R-clock.

15. A clock calibration system adapted selectively to modify, as a function of an adjustment parameter ("AP"), a low-accuracy generated clock ("G-clock") having a selected frequency ("F") to produce a calibrated clock ("C-clock") having a selected reference frequency ("$F_{REF}$"), said clock calibration system comprising:
an AP generator adapted to develop the AP, in a two's complement form, as a function of a frequency mismatch between the G-clock and a high accuracy reference clock ("R-clock") of frequency $F_{REF}$; and
a C-clock calibrator adapted to:
develop a half clock ("H-clock") having a frequency substantially one-half (½) the frequency of said G-clock; and
selectively over time distribute pulse modifications in response to the AP, each of said modifications performing a selected one of deletion of a single pulse and insertion of a single pulse in the H-clock to produce the C-clock.

16. A clock calibration system adapted selectively to modify, as a function of an adjustment parameter ("AP"), a low-accuracy generated clock ("G-clock") having a selected frequency ("F") to produce a calibrated clock ("C-clock") having a selected reference frequency ("$F_{REF}$"), said clock calibration system comprising:
a reference period ("$P_{REF}$") generator adapted to develop a $P_{REF}$ as a function of said G-clock;
an n+1-bit two's-complement counter adapted to count reference clock ("R-clock") pulses during said $P_{REF}$, wherein the resulting count, being said AP:
if positive, represents a number of pulses to be added to conform G-clock to R-clock;
if negative, represents a number of edges to be deleted to conform G-clock to R-clock; and
if zero, represents that G-clock conforms to R-clock;
a control adapted to:
enable said n+1-bit two's-complement counter to count edges of said R-clock to develop said AP, when said $P_{REF}$ is asserted; and
a C-clock calibrator adapted to:
develop a half clock ("H-clock") having a frequency substantially one-half (½) the frequency of said G-clock; and
selectively over time distribute pulse modifications in response to the AP, each of said modifications performing a selected one of deletion of a single pulse and insertion of a single pulse in the H-clock to produce the C-clock.

17. The clock calibration system of claim 16 further comprising:
a G-clock generator, coupled to said $P_{REF}$ and said C-clock calibrator, adapted to develop said G-clock.

18. The clock calibration system of claim 17 wherein said G-clock generator is a selected one of an RC oscillator and a crystal oscillator.

19. The clock calibration system of claim 16 further comprising:
an R-clock generator, coupled to said control and said n+1-bit two's-complement counter, adapted to develop said R-clock.

20. The clock calibration system of claim 19 wherein said R-clock generator is a selected one of an RC oscillator and a crystal oscillator.

21. The clock calibration system of claim 16 wherein said control is further adapted to periodically enable said n+1-bit two's-complement counter to count edges of said R-clock to develop said AP, when said $P_{REF}$ is asserted.

22. The clock calibration system of claim 16 wherein said control is further adapted, based on an interrupt scheme, to enable said n+1 bit two's-complement counter to count edges of said R-clock to develop said AP, when said $P_{REF}$ is asserted.

23. The clock calibration system of claim 22 wherein an interrupt of said interrupt scheme occurs at a predetermined selectable time interval.

24. The clock calibration system of claim 22 wherein said interrupt is based upon a predetermined sensed condition.

25. The clock calibration system of claim 16 wherein, during a test mode, said R-clock is several powers of 2 faster than a normal mode, and said reference period generator develops said $P_{REF}$ as:

$$P_{REF}=(1+\text{resadj})*(1+F_{REF})$$

where:

$$\text{resadj}=F_{PWR2}/F_{HALF};$$

$F_{PWR2}$=a frequency that is a selected power of 2;
$F_{HALF}$=½ the G-clock frequency, i.e., the H-clock frequency; and
$F_{REF}$=R-clock.

26. The clock calibration system of claim 16 wherein said AP is stored in a non-volatile memory.

27. A multiple clock calibration system adapted selectively to modify, as a function of an adjustment parameter ("$AP^C$"), a generated clock ("G-clock") having a frequency ("$F_e$") to produce a calibrated clock ("C-clock") having a desired frequency, and further adapted selectively to modify, as a function of an adjustment parameter ("$AP^G$"), a reference clock ("R-clock") having a selected frequency ("$F_R$") to produce said G-clock, said multiple clock calibration system comprising:

a C-clock calibrator adapted to:
  develop a first half clock ("H-clock$_1$") having a frequency substantially one-half (½) the frequency of said G-clock; and
  selectively over time distribute pulse modifications in response to the $AP^C$, each of said modifications performing a selected one of deletion of a single pulse and insertion of a single pulse in the H-clock$_s$ to produce the C-clock; and a G-clock generator adapted to:
  develop a second half clock ("H-clock$_2$") having a frequency substantially one-half (½) the frequency of said R-clock; and
  selectively over time distribute pulse modifications in response to the $AP^G$, each of said modifications performing a selected one of deletion of a single pulse and insertion of a single pulse in the H-clock$_2$ to produce the G-clock.

28. The multiple clock calibration system of claim 27 further comprising an adjustment parameter ("$AP^C$") generator, adapted to develop said $AP^C$, in a two's complement form, as a function of a frequency mismatch between said G-clock and a reference clock of known frequency ("$F_{REF}$").

29. The adjustment parameter ("$AP^C$") generator of claim 28 comprising:
  a reference period ("$P_{REF}$") generator adapted to develop a $P_{REF}$ as a function of said G-clock; and
  an n+1-bit two's-complement counter adapted to count said reference clock pulses during said $P_{REF}$, wherein the resulting count, being said $AP^C$:
    if positive, represents a number of pulses to be added to conform G-clock to said reference clock;
    if negative, represents a number of edges to be deleted to conform G-clock to said reference clock; and
    if zero, represents that G-clock conforms to said reference clock.

30. The AP generator of claim 29 wherein said $P_{REF}$ generator develops said $P_{REF}$ as:

$$P_{REF} = (1 \div \text{resadj}) * (1 \div F_{REF})$$

where:

$$\text{resadj} = F_{PWR2}/F_{HALF};$$

$F_{PWR2}$ = a frequency that is a selected power of 2;
$F_{HALF}$ = ½ the G-clock frequency, i.e., the H-clock$_1$ frequency; and
$F_{REF}$ = reference clock.

31. The multiple clock generation system of claim 27 wherein said $AP^G$ is developed using a manual calibration process.

* * * * *